United States Patent
Kim et al.

(10) Patent No.: US 10,685,890 B2
(45) Date of Patent: *Jun. 16, 2020

(54) SEMICONDUCTOR PACKAGE HAVING REDISTRIBUTION PATTERN AND PASSIVATION PATTERNS AND METHOD OF FABRICATING THE SAME

(71) Applicant: Samsung Electronics Co., Ltd., Suwon-si, Gyeonggi-do (KR)

(72) Inventors: Jongyoun Kim, Seoul (KR); Seokhyun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/279,118

(22) Filed: Feb. 19, 2019

(65) Prior Publication Data

US 2019/0181064 A1 Jun. 13, 2019

Related U.S. Application Data

(63) Continuation of application No. 15/603,859, filed on May 24, 2017, now Pat. No. 10,319,650.

(30) Foreign Application Priority Data

Sep. 13, 2016 (KR) .......................... 10-2016-0117904

(51) Int. Cl.
*H01L 21/66* (2006.01)
*H01L 23/498* (2006.01)
(Continued)

(52) U.S. Cl.
CPC ............ *H01L 22/32* (2013.01); *H01L 21/486* (2013.01); *H01L 23/3128* (2013.01);
(Continued)

(58) Field of Classification Search
CPC ... H01L 22/32; H01L 21/486; H01L 23/3128; H01L 23/49811; H01L 23/5384;
(Continued)

(56) References Cited

U.S. PATENT DOCUMENTS 6,400,021 B1    6/2002  Cho
6,750,135 B2    6/2004  Elenius et al.
(Continued)

FOREIGN PATENT DOCUMENTS

KR    10-2001-0004529 A    1/2001
KR    10-2009-0096186 A    9/2009

*Primary Examiner* — Alexander O Williams
(74) *Attorney, Agent, or Firm* — Harness, Dickey & Pierce, P.L.C.

(57) ABSTRACT

A semiconductor package including a redistribution substrate, and a semiconductor chip mounted on the redistribution substrate, the semiconductor chip having a conductive pad on one surface thereof may be provided. The redistribution substrate may include a first passivation pattern on the conductive pad, the first passivation pattern exposing a portion of the conductive pad, and a redistribution pattern covering the portion of the conductive pad exposed by the first passivation pattern and surrounding the first passivation pattern.

20 Claims, 5 Drawing Sheets

(51) Int. Cl.
*H01L 23/31* (2006.01)
*H01L 25/10* (2006.01)
*H01L 21/48* (2006.01)
*H01L 23/538* (2006.01)

(52) U.S. Cl.
CPC .... *H01L 23/49811* (2013.01); *H01L 23/5384* (2013.01); *H01L 23/5389* (2013.01); *H01L 25/105* (2013.01); *H01L 2224/18* (2013.01); *H01L 2225/1023* (2013.01); *H01L 2225/1058* (2013.01); *H01L 2924/181* (2013.01)

(58) Field of Classification Search
CPC ............... H01L 23/5389; H01L 25/105; H01L 2924/181; H01L 2225/1023; H01L 2225/1058; H01L 2224/18; H01L 21/66; H01L 23/31; H01L 25/10; H01L 21/48; H01L 23/538; H01L 23/498; H01L 2924/00012
USPC .......................................................... 257/773
See application file for complete search history.

(56) References Cited

U.S. PATENT DOCUMENTS

| | | | |
|---|---|---|---|
| 7,489,037 | B2 | 2/2009 | Chien et al. |
| 8,143,693 | B2 | 3/2012 | Baek et al. |
| 8,338,946 | B2 | 12/2012 | Yanase et al. |
| 10,319,650 | B2 * | 6/2019 | Kim ................. H01L 23/49811 |
| 2015/0031184 | A1 | 1/2015 | Yen et al. |
| 2017/0125347 | A1 | 5/2017 | Hu |
| 2017/0170111 | A1 | 6/2017 | Reingruber et al. |
| 2017/0287853 | A1 | 10/2017 | Kim et al. |
| 2018/0033770 | A1 | 2/2018 | Hsu et al. |
| 2018/0076123 | A1 * | 3/2018 | Kim ................. H01L 23/49811 |
| 2018/0096968 | A1 | 4/2018 | Lee et al. |
| 2018/0102322 | A1 | 4/2018 | Kang et al. |
| 2018/0102343 | A1 | 4/2018 | Lin et al. |
| 2018/0138029 | A1 | 5/2018 | Kim et al. |
| 2018/0145033 | A1 | 5/2018 | Yi et al. |
| 2018/0145036 | A1 | 5/2018 | Kim et al. |
| 2018/0151538 | A1 | 5/2018 | Hung et al. |
| 2018/0158791 | A1 | 6/2018 | Seol et al. |
| 2018/0158798 | A1 | 6/2018 | Lin et al. |

* cited by examiner

SEMICONDUCTOR PACKAGE HAVING REDISTRIBUTION PATTERN AND PASSIVATION PATTERNS AND METHOD OF FABRICATING THE SAME

CROSS-REFERENCE TO RELATED APPLICATION

This U.S. non-provisional patent application is a continuation of U.S. patent application Ser. No. 15/603,859, filed on May 24, 2017, and issued as U.S. Pat. No. 10,319,650 on Jun. 11, 2019, which claims priority under 35 U.S.C. § 119 to Korean Patent Application No. 10-2016-0117904, filed on Sep. 13, 2016, in the Korean Intellectual Property Office, the disclosure of each of which is hereby incorporated by reference in its entirety.

BACKGROUND

Example embodiments of the inventive concepts relate to semiconductor packages and/or methods of fabricating a redistribution pattern included in the semiconductor package.

Light, small, and high-speed semiconductor devices have been demanded with the development of an electronic industry. Thus, reliability of semiconductor packages is desired to be improved for improved electrical connection between internal elements of semiconductor packages and/or between semiconductor packages.

SUMMARY

Some example embodiments of the inventive concepts may provide semiconductor packages with improved reliability and/or methods of fabricating a redistribution pattern included in the semiconductor package.

According to an example embodiment, a semiconductor package may include a redistribution substrate, and a semiconductor chip mounted on the redistribution substrate and having a conductive pad disposed on one surface of the semiconductor chip. The redistribution substrate may include a first passivation pattern disposed on the conductive pad and exposing a portion of the conductive pad, and a redistribution pattern covering a portion of the conductive pad exposed by the first passivation pattern and surrounding the first passivation pattern.

According to an example embodiment, a semiconductor package may include a substrate including a first conductive pad on one surface thereof, and a semiconductor chip disposed on the substrate and including a second conductive pad on one surface thereof. The substrate may include redistribution patterns electrically connecting the first conductive pad to the second conductive pad, and first and second passivation patterns on the second conductive pad, while being laterally spaced apart from each other. At least one of the redistribution patterns may cover the first passivation pattern.

According to an example embodiment, a method of fabricating a redistribution pattern may include forming a passivation layer on a surface of a semiconductor chip, the semiconductor chip having a conductive pad, removing a first region of the passivation layer disposed on the conductive pad to expose the conductive pad, removing a second region of the passivation layer, which surrounds the first region, to divide the passivation layer into first and second passivation patterns laterally spaced apart from each other, and forming a redistribution pattern on the exposed conductive pad and the first and second passivation patterns. The redistribution pattern may fill openings formed by the removing of the first region and the removing of the second region.

According to an example embodiment, a semiconductor package may include a semiconductor chip having a conductive pad on one surface thereof, and a redistribution substrate having the semiconductor chip thereon. The redistribution substrate may include a first passivation pattern covering a first portion of the conductive pad, and a redistribution pattern covering a second portion of the conductive pad, which is exposed by the first passivation pattern, and surrounding an outside of the first passivation pattern.

BRIEF DESCRIPTION OF THE DRAWINGS

The inventive concepts will become more apparent in view of the attached drawings and accompanying detailed description.

DETAILED DESCRIPTION

Figure 1:
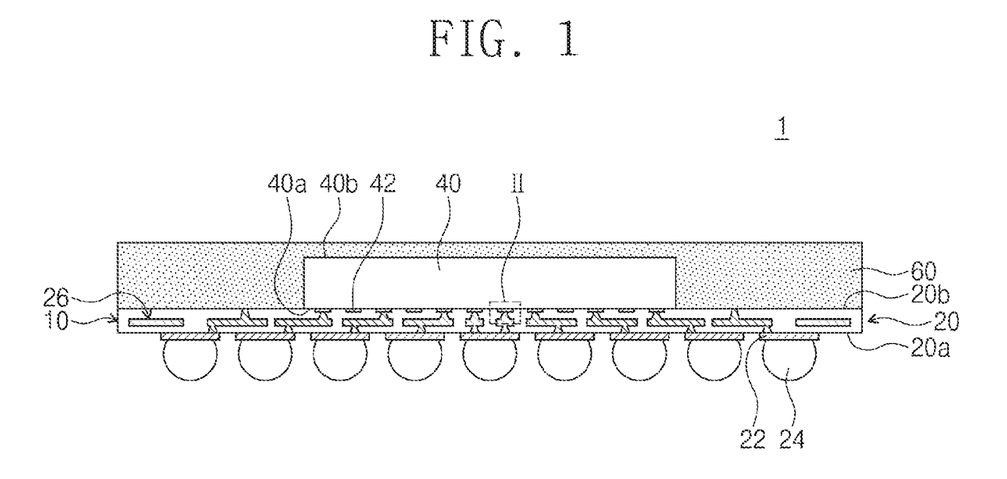
FIG. 1 is a cross-sectional view illustrating a semiconductor package according to some example embodiments of the inventive concepts.

FIG. 1 is a cross-sectional view illustrating a semiconductor package 1 according to some example embodiments of the inventive concepts. The semiconductor package 1 may include a substrate 20, a semiconductor chip 40, and a molding layer 60. The semiconductor package 1 may be, for example, a fan-out semiconductor package.

The substrate 20 may be a redistribution substrate. The redistribution substrate may be thinner than a printed circuit board (PCB), and thus a total size of the semiconductor package 1 may be reduced. The substrate 20 may have a first surface 20a and a second surface 20b opposite to each other. The first surface 20a may be a bottom surface of the substrate 20, and the second surface 20b may be a top surface of the substrate 20. First conductive pads 22 may be provided on the bottom surface 20a of the substrate 20, and external solder balls 24 may be connected to the first conductive pads 22, respectively. The external solder balls 24 may receive input-output/test signals and input-output/test voltages from an external device (not shown).

The first conductive pads 22 may include connection pads and test pads. The connection pads may include a connection pad for power supply, a connection pad for grounding, and/or connection pads for signal transmission. The test pads may be pads to which test voltages are applied to evaluate characteristics and/or reliability of a semiconductor package.

Figure 2:
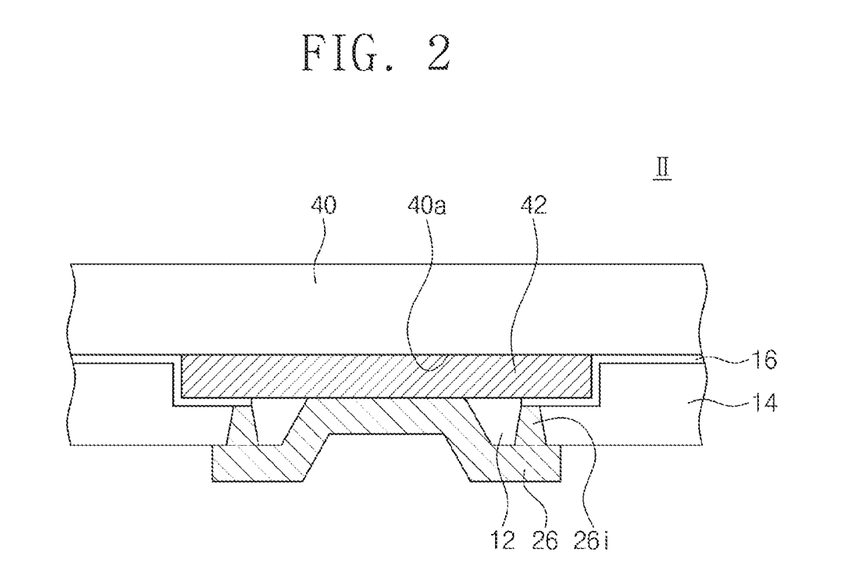
FIG. 2 is an enlarged view of a portion 'II' of FIG. 1 according to some example embodiments of the inventive concepts.

The substrate 20 may include an insulating layer 10 and redistribution patterns 26 disposed in the insulating layer 10. Even though not shown in the drawings, the insulating layer 10 may include a plurality of stacked layers. For example, the insulating layer 10 may include insulating layers and passivation layers. Referring to FIG. 2, the insulating layer 10 may include an insulating pattern 16 and passivation patterns 12 and 14, as will be described later.

The redistribution patterns 26 may electrically connect the first conductive pads 22 of the substrate 20 to second conductive pads 42 of the semiconductor chip 40. Further, even though not shown in the drawings, integrated circuits may be disposed in the substrate 20, and the redistribution patterns 26 may be electrically connected to the integrated circuits. The redistribution patterns 26 may include a conductive layer within the insulating layer 10 and a via vertically penetrating the insulating layer 10. However, in the present specification, the conductive layer and the via of the redistribution pattern 26 are not distinguished from each other for the purpose of ease and convenience of explanation.

FIG. 2 is an enlarged view of a portion 'II' of FIG. 1 according to some example embodiments of the inventive concepts. FIG. 2 illustrates a pad connection structure that is in direct contact with the second conductive pad 42 of the semiconductor chip 40. The second conductive pad 42 illustrated in FIG. 2 may be, for example, the test pad. Here, the pad connection structure may include the first and second passivation patterns 12 and 14, and the insulating pattern 16, and at least one of the redistribution patterns 26 in direct contact with the second conductive pad 42. Hereinafter, only the redistribution pattern being in direct contact with the second conductive pad 42 is referred to as the redistribution pattern for the purpose of ease and convenience of explanation.

Referring to FIGS. 1 and 2, a first passivation pattern 12 may be disposed on the second conductive pad 42. For example, the first passivation pattern 12 may be disposed under a bottom surface of the second conductive pad 42 and may vertically overlap with the second conductive pad 42. An outer sidewall of the first passivation pattern 12 may be laterally offset from an outer sidewall of the second conductive pad 42 in a direction from the outer sidewall of the second conductive pad 42 toward a center of the second conductive pad 42. For example, the outer sidewall of the first passivation pattern 12 may be disposed under the bottom surface of the second conductive pad 42. That is, the outer sidewall of the first passivation pattern 12 may be disposed inside a region surrounded by the outer sidewall of the second conductive pad 42 when viewed from a plan view. The first passivation pattern 12 may expose a portion of the second conductive pad 42. For example, the first passivation pattern 12 may expose a central region of the second conductive pad 42.

A second passivation pattern 14 laterally spaced apart from the first passivation pattern 12 may be disposed outside the first passivation pattern 12. A portion of the second passivation pattern 14 may vertically overlap with the second conductive pad 42, and another portion of the second passivation pattern 14 may not vertically overlap with the second conductive pad 42. For example, an inner portion of the second passivation pattern 14 may vertically overlap with the second conductive pad 42, and the rest of the second passivation pattern 14 may be disposed on a bottom surface 40a of the semiconductor chip 40, on which the second conductive pad 42 is not provided. For example, the inner portion of the second passivation pattern 14 may be disposed under the bottom surface of the second conductive pad 42, and the rest of the second passivation pattern 14 may be disposed under the bottom surface 40a of the semiconductor chip 40 that is exposed by the second conductive pad 42.

The first and second passivation patterns 12 and 14 may be disposed at the same level. Here, the level may mean a vertical distance from a surface of the substrate 20 or semiconductor chip 40. The first and second passivation patterns 12 and 14 may be formed of the same material. The first and second passivation patterns 12 and 14 may include, for example, an insulating polymer.

The redistribution pattern 26 may cover the portion of the second conductive pad 42 exposed by the first passivation pattern 12, and may fill a space between the first and second passivation patterns 12 and 14. The redistribution pattern 26 may cover the central redistribution pattern of the second conductive pad 42 so as to be in direct contact with the second conductive pad 42. The redistribution pattern 26 may include an isolation region 26i filling the space between the first and second passivation patterns 12 and 14. The redistribution pattern 26 may include, for example, copper (Cu).

The insulating pattern 16 may be disposed between the second passivation pattern 14 and the second conductive pad 42. A portion (e.g., an inner end portion) of the insulating pattern 16 may be disposed between the second conductive pad 42 and the isolation region 26i. The insulating pattern 16 may include, but not limited to, silicon nitride.

The isolation region 26i may isolate the first and second passivation patterns 12 and 14 from each other, and thus the first passivation pattern 12 being in direct contact with the second conductive pad 42 may be isolated on the bottom surface of the second conductive pad 42. Thus, the redistribution pattern 26 may surround the first passivation pattern 12 to shield the first passivation pattern 12.

Referring again to FIG. 1, the semiconductor chip 40 may be mounted on the substrate 20. The semiconductor chip 40 may be, but not limited to, a memory chip. The semiconductor chip 40 may have a first surface 40a and a second surface 40b opposite to each other. The first surface 40a may be the bottom surface of the semiconductor chip 40, and the second surface 40b may be a top surface of the semiconductor chip 40. The second conductive pads 42 may be formed on the bottom surface 40a of the semiconductor chip 40. Even though not shown in the drawings, integrated circuits may be disposed in the semiconductor chip 40 and the second conductive pads 42 may be electrically connected to the integrated circuits of the semiconductor chip 40.

The second conductive pads 42 may include connection pads and test pads. The connection pads of the second conductive pads 42 may include a connection pad for power supply, a connection pad for grounding, and/or connection pads for signal transmission. The test pads of the second conductive pads 42 may be pads to which test voltages are applied to evaluate characteristics and/or reliability of a semiconductor package.

The molding layer 60 may cover the semiconductor chip 40 on the substrate 20. The molding layer 60 may include, for example, an insulating polymer such as an epoxy molding compound (EMC). The molding layer 60 may protect the semiconductor chip 40 from external environment such as physical impact or moisture. FIG. 1 illustrates the molding layer 60 covering the semiconductor chip 40 on the substrate 20. In some example embodiments, a top surface of the molding layer 60 may be substantially coplanar with the top surface 40b of the semiconductor chip 40, and thus the top surface 40b of the semiconductor chip 40 may be exposed.

According to the above mentioned example embodiments, the redistribution pattern 26 may be connected directly to the second conductive pad 42 of the semiconductor chip 40 in the pad connection structure. However, example embodiments of the inventive concepts are not limited thereto. For example, the pad connection structure described above may be applied to another redistribution pattern, which is connected to the first conductive pad 22 of the substrate 20. According to the above mentioned example embodiments, the conductive pads protrude from the surfaces of the substrate 20 and the semiconductor chip 40. However, example embodiments of the inventive concepts are not limited thereto.

Figure 3A:
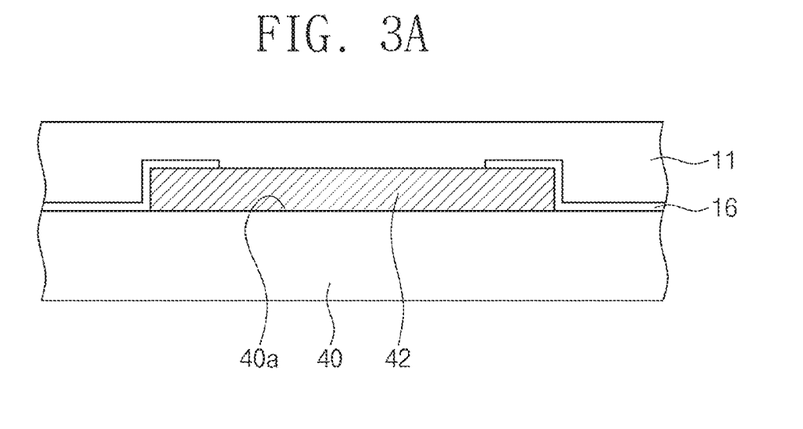
FIGS. 3A to 3C are cross-sectional views illustrating a method of forming a pad connection structure of FIG. 2.
Figure 3B:
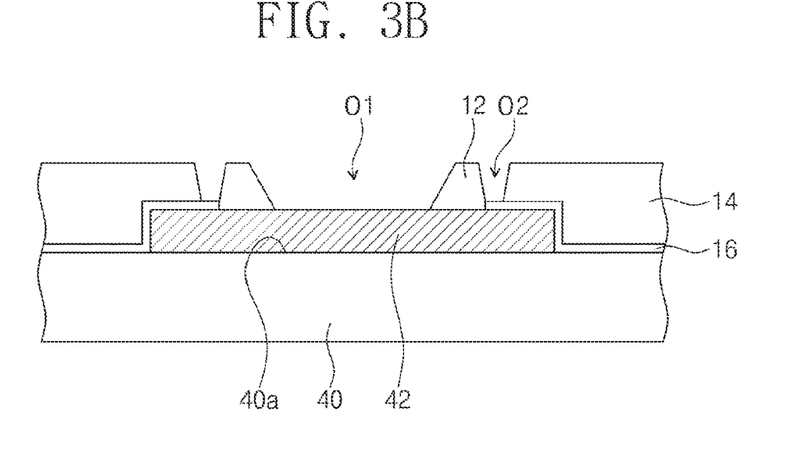
Figure 3C:
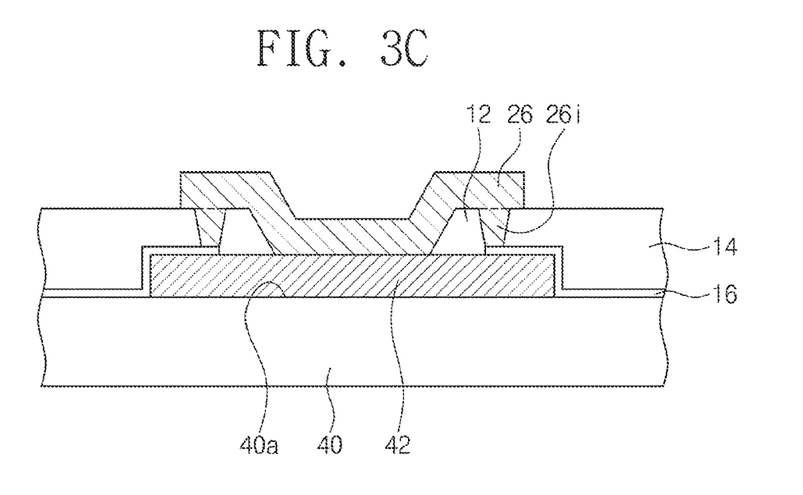

FIGS. 3A to 3C are cross-sectional views illustrating a method of forming a pad connection structure of FIG. 2. At this time, FIGS. 3A to 3C illustrate the pad connection structure of FIGS. 1 and 2 which is turned over. Referring to FIG. 3A, the insulating pattern 16 and a passivation layer 11 may be formed on the bottom surface 40a of the semiconductor chip 40 and the second conductive pad 42.

For example, an insulating layer may be formed on the bottom surface 40a of the semiconductor chip 40 and the second conductive pad 42, and a patterning process may be performed on the insulating layer to form the insulating pattern 16 by which a portion of the second conductive pad 42 is exposed. The insulating pattern 16 may expose a central region of the second conductive pad 42. The insulating layer may include, but not limited to, silicon nitride. An end portion of the insulating pattern 16 may remain on an edge region of the second conductive pad 42. Next, the passivation layer 11 may be formed on the insulating pattern 16 and the second conductive pad 42, and a planarization process may be performed on the passivation layer 11 in such a way that a top surface of the passivation layer 11 is substantially flat. The passivation layer 11 may include, for example, an insulating polymer.

Referring to FIG. 3B, the passivation layer 11 may be patterned to form first and second passivation patterns 12 and 14. For example, a first region of the passivation layer 11 may be removed to form a first opening O1, and a second region of the passivation layer 11 outside the first region may be removed to form a second opening O2. The first region may vertically overlap with a central region of the second conductive pad 42, and thus the first opening O1 may expose the central region of the second conductive pad 42. The second region may vertically overlap with an edge region of the second conductive pad 42, and thus the second opening O2 may expose the insulating pattern 16 disposed on the edge region of the second conductive pad 42.

The passivation layer 11 may be divided into the first and second passivation patterns 12 and 14 by the first and second openings O1 and O2. Thus, the first passivation pattern 12 may be isolated on the second conductive pad 42. The first and second openings O1 and O2 may be formed at the same time. However, example embodiments of the inventive concepts are not limited thereto. In certain example embodiments, the first and second openings O1 and O2 may be sequentially formed. For example, the second opening O2 may be formed after the formation of the first opening O1.

Referring to FIG. 3C, a redistribution pattern 26 may be formed to fill the first and second openings O1 and O2. For example, the redistribution pattern 26 may cover the exposed portion of the second conductive pad 42 and the first passivation pattern 12. The redistribution pattern 26 may surround the first passivation pattern 12. In some example embodiments, a metal layer may be deposited, and the deposited metal layer may be patterned to form the redistribution pattern 26. A portion of the redistribution pattern 26, which fills the second opening O2 between the first and second passivation patterns 12 and 14, may define the isolation region 26i. The redistribution pattern 26 may include, for example, copper (Cu).

Thereafter, additional insulating and/or passivation layers and additional redistribution patterns may be formed to complete the substrate 20 including the insulating layer 10 and the redistribution patterns 26.

According to the aforementioned example embodiments of the inventive concepts, the passivation layer on the second conductive pad 42 may be divided into the first and second passivation patterns 12 and 14. Thus, the first passivation pattern 12, which is in direct contact with the second conductive pad 42, may be an isolated pattern. Thus, impurity ions existing inside and outside the package may be mitigated or prevented from being transferred to the second conductive pad 42 through a passivation pattern. For example, chloride ions may be mitigated or prevented from being diffused into the second conductive pad 42. Because the first and second openings O1 and O2 are formed at the same time and the redistribution pattern 26 is formed to the openings O1 and O2, fabrication processes may be simplified. Thus, reliability of the semiconductor chip may be improved.

In a conventional semiconductor package, ions inside and outside the semiconductor package may be activated and be moved to a spot to which a high voltage is supplied during operation. For example, at least one of a substrate, a molding layer, or an underfill layer (not shown) of the conventional semiconductor package may include negative ions such as chloride ions. Thus, if the passivation pattern in direct contact with the conductive pad 42 is not an isolated pattern as in some example embodiments of the inventive concepts, impurity ions may be transferred to the second conductive pad 42 through the passivation pattern, thereby corroding the second conductive pad 42. If a reliability test (e.g., a temperature-humidity-bias (THB) test) of the semiconductor package is performed under environment of relatively high temperature and/or humidity, the transfer of the impurity ions may be accelerated, and thus accelerate the corrosion of the second conductive pad 42.

Figure 4:
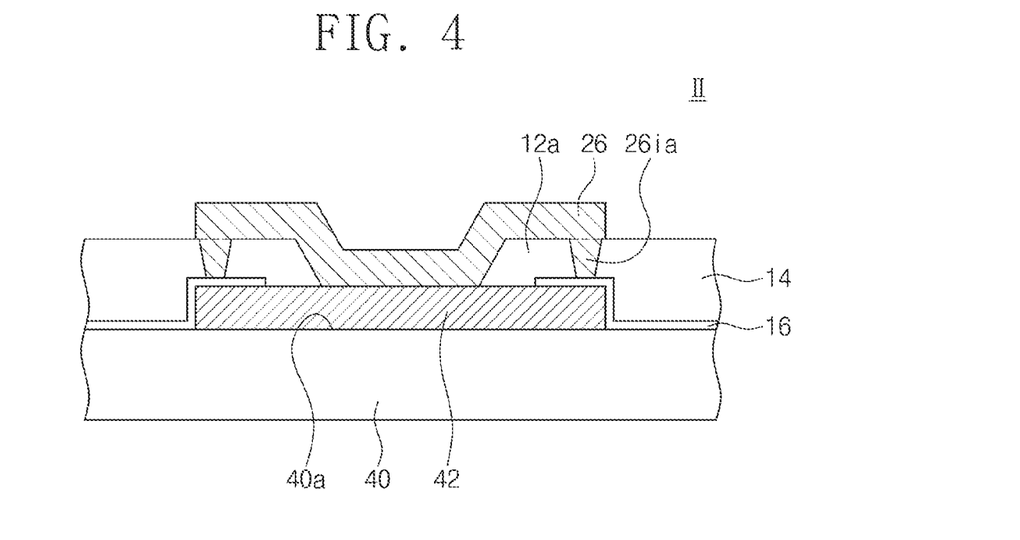
FIG. 4 is an enlarged view of a portion 'II' of FIG. 1 according to some example embodiments of the inventive concepts.

FIG. 4 is an enlarged view of a portion 'II' of FIG. 1 according to some example embodiments of the inventive concepts. FIG. 4 also illustrates a pad connection structure turned over like FIGS. 3A to 3C. In the embodiment of FIG. 4, the same elements as described with reference to FIGS. 1 to 3C will be indicated by the same reference numerals or the same reference designators and the descriptions thereto will be omitted or mentioned briefly for the purpose of ease and convenience of explanation.

Referring to FIG. 4, a first passivation pattern 12a may include a first portion, which is formed on the insulating pattern 16, and a second portion extending from the first portion. For example, the first portion of the first passivation pattern 12a may be disposed between the second portion of the first passivation pattern 12a and an isolation region 26i a of a redistribution pattern 26. A horizontal distance from the center of the second conductive pad 42 to the first portion of the first passivation pattern 12a may be smaller than a horizontal distance from the center of the second conductive pad 42 to the isolation region 26*ia*. In some example embodiments, an inner portion of the first passivation pattern 12*a* may be in direct contact with the second conductive pad 42, but an outer portion of the first passivation pattern 12*a* may be disposed on the insulating pattern 16. A portion of the insulating pattern 16 may be disposed between the second conductive pad 42 and the first passivation pattern 12*a*. For example, an inner end portion of the insulating pattern 16 may be disposed between the second conductive pad 42 and the first passivation pattern 12*a*.

Figure 5:
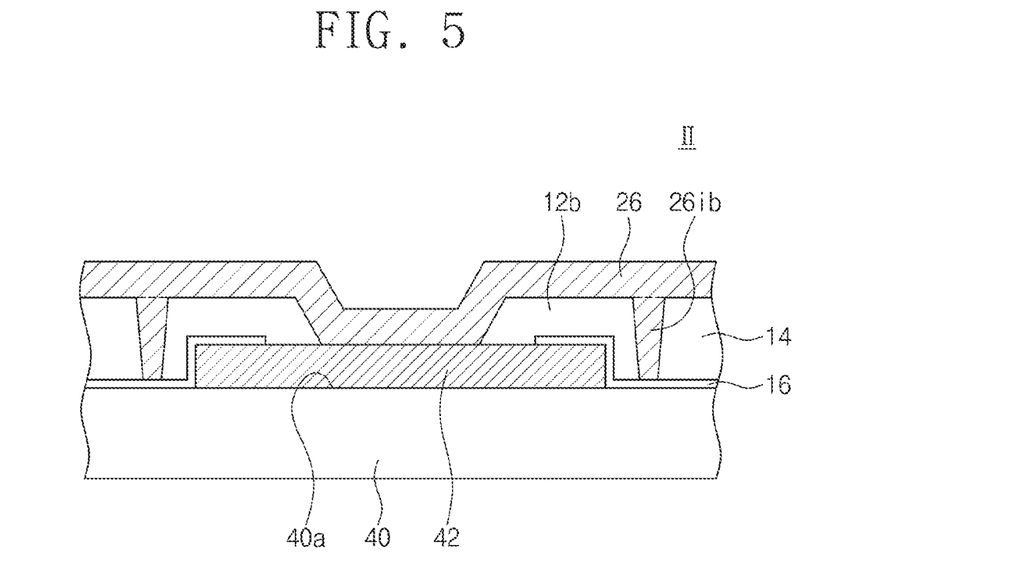
FIG. 5 is an enlarged view of a portion 'II' of FIG. 1 according to some example embodiments of the inventive concepts.

FIG. 5 is an enlarged view of a portion 'II' of FIG. 1 according to some example embodiments of the inventive concepts. FIG. 5 also illustrates a pad connection structure turned over like FIG. 4. In the embodiment of FIG. 5, the same elements as described with reference to FIG. 4 will be indicated by the same reference numerals or the same reference designators and the descriptions thereto will be omitted or mentioned briefly for the purpose of ease and convenience of explanation.

Referring to FIG. 5, an outer sidewall of a first passivation pattern 12*b* may cover or surround the outer sidewall of the second conductive pad 42. For example, the outer sidewall of the first passivation pattern 12*b* may be disposed outside an edge or a boundary of the second conductive pad 42 when viewed from a plan view. Thus, an isolation region 26*ib* of the redistribution pattern 26 may be laterally spaced apart from the second conductive pad 42 and may be disposed outside the second conductive pad 42.

Figure 6:
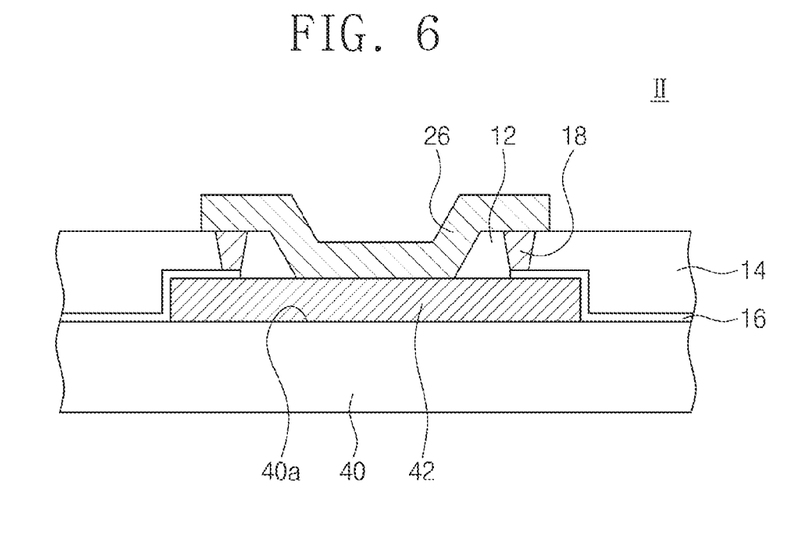
FIG. 6 is an enlarged view of a portion 'II' of FIG. 1 according to some example embodiments of the inventive concepts.

FIG. 6 is an enlarged view of a portion 'II' of FIG. 1 according to some example embodiments of the inventive concepts. FIG. 6 also illustrates a pad connection structure turned over like FIG. 5. In the embodiment of FIG. 6, the same elements as described with reference to FIG. 2 will be indicated by the same reference numerals or the same reference designators and the descriptions thereto will be omitted or mentioned briefly for the purpose of ease and convenience of explanation.

A semiconductor package may include a shielding pattern 18 (instead of the isolation region of the redistribution pattern 26*i*, 26*ia*, or 26*ib* in the above example embodiments) filling the space between the first and second passivation patterns 12 and 14. The shielding pattern 18 may include a material that has a lower hygroscopic property than the redistribution pattern 26 and/or that is capable of effectively preventing ion transfer. A level of the shielding pattern 18 may be the same as levels of the first and second passivation patterns 12 and 14.

Figure 7:
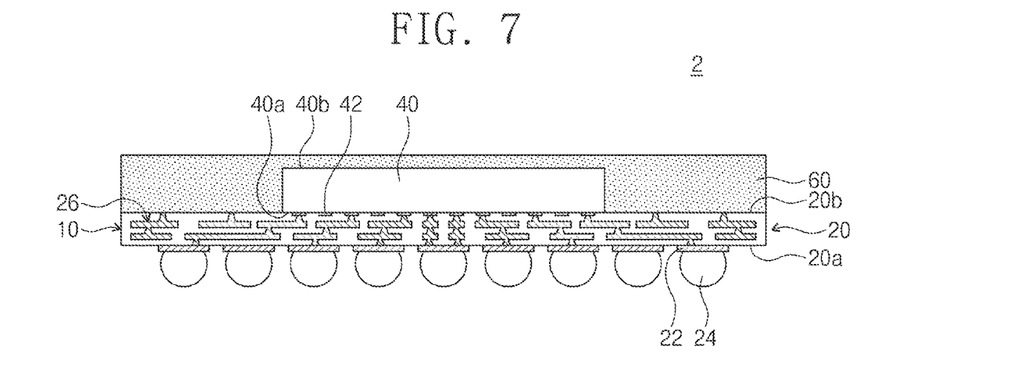
FIG. 7 is a cross-sectional view illustrating a semiconductor package according to some example embodiments of the inventive concepts.

FIG. 7 is a cross-sectional view illustrating a semiconductor package 2 according to some example embodiments of the inventive concepts. In the semiconductor package 2, the same elements as described in the semiconductor package 1 of FIG. 1 will be indicated by the same reference numerals or the same reference designators and the descriptions thereto will be omitted or mentioned briefly for the purpose of ease and convenience of explanation.

Redistribution patterns 26 of the semiconductor package 2 may constitute a multi-layered structure, and an insulating layer 10 of the semiconductor package 2 may have a multi-layered structure. For example, the example embodiments of the inventive concepts may be applied to any package structure, in which the second conductive pad 42 is in direct contact with the redistribution pattern 26, regardless of the structures and shapes of the insulating layer 10 and the redistribution patterns 26.

Figure 8:
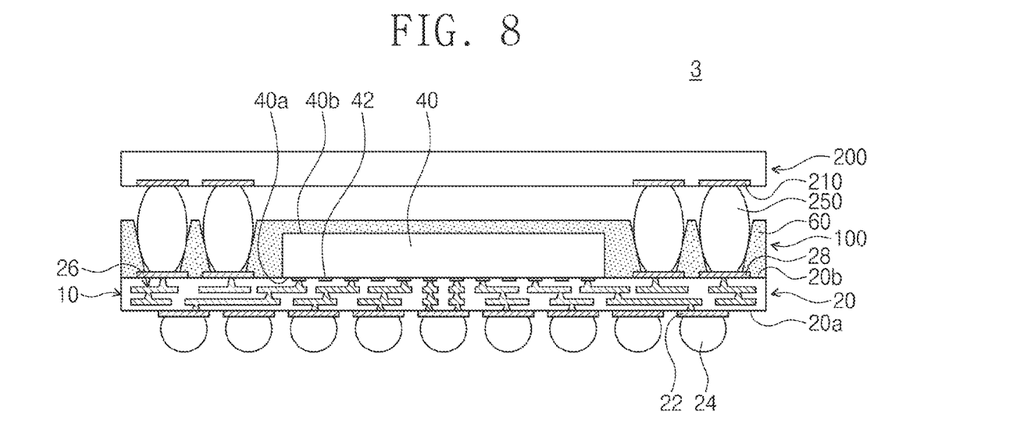
FIG. 8 is a cross-sectional view illustrating a semiconductor package according to some example embodiments of the inventive concepts.

FIG. 8 is a cross-sectional view illustrating a semiconductor package 3 according to some example embodiments of the inventive concepts. The semiconductor package 3 may be a package-on-package (PoP) type device. The semiconductor package 3 may include a lower package 100 and an upper package 200 mounted on the lower package 100. The lower package 100 of FIG. 8 may be any one of the semiconductor packages 1 and 2 described with reference to FIGS. 1 through 6. Thus, in the embodiment of FIG. 8, the same descriptions as in the example embodiments of FIGS. 1 and 6 will be omitted or mentioned briefly for the purpose of ease and convenience of explanation.

The upper package 200 and the lower package 100 may be connected to each other through at least one solder portion 250. In some example embodiments, the upper package 200 may include a memory chip, and the lower package 100 may include a logic chip. The pad connection structure according to some example embodiments of the inventive concepts may also be applied to a connection portion which is connected to at least one redistribution pattern connected to third conductive pads 28 disposed on the top surface 20*a* of the substrate 20 of the lower package 100 and/or which is connected to a fourth conductive pad 210 of the upper package 200.

Figure 9:
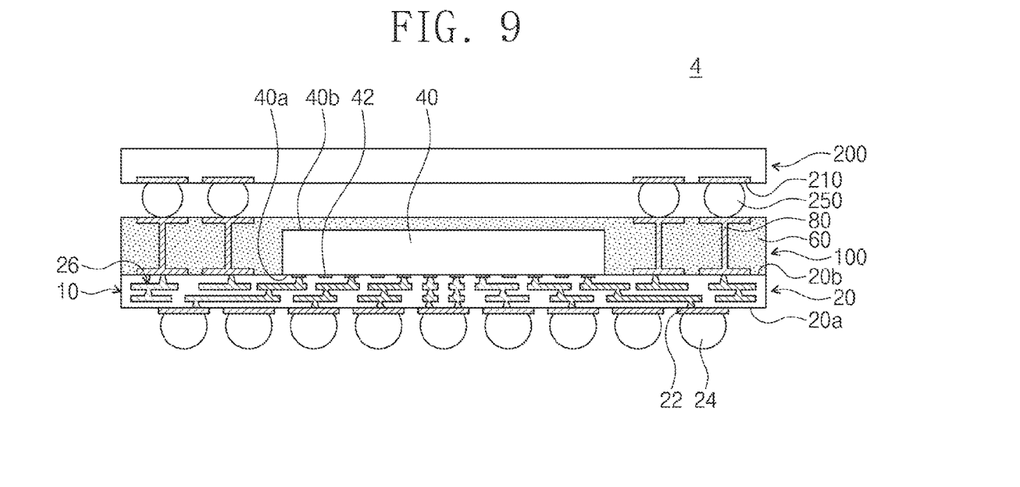
FIG. 9 is a cross-sectional view illustrating a semiconductor package according to some example embodiments of the inventive concepts.

FIG. 9 is a cross-sectional view illustrating a semiconductor package 4 according to some example embodiments of the inventive concepts. In the embodiment of FIG. 9, the same elements as described with reference to FIG. 8 will be indicated by the same reference numerals or the same reference designators and the descriptions thereto will be omitted or mentioned briefly for the purpose of ease and convenience of explanation.

A lower package 100 may further include connection portions 80 disposed outside the semiconductor chip 40. Although not shown in the drawings, the lower package 100 may further include an interposer substrate or printed circuit board including the connection portions 80. The pad connection structure according to some example embodiments of the inventive concepts may also be applied to at least one of redistribution patterns connected to the connection portions 80.

According to some example embodiments of the inventive concepts, the passivation layer on the conductive pad may be divided into the first and second passivation patterns laterally spaced apart from each other, and the first passivation pattern isolated from the second passivation pattern may be in direct contact with the conductive pad. Thus, impurity ions existing inside and outside the package may be mitigated or prevented from being transferred to the conductive pad through a passivation pattern. For example, chloride ions into the conductive pad may be mitigated or prevented from corroding the conductive pad. Thus, reliability of the semiconductor chip may be improved without an additional process or complex fabrication processes.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a redistribution substrate;
   a semiconductor chip mounted on the redistribution substrate, the semiconductor chip having a conductive pad on one surface thereof;
   a molding layer covering the semiconductor chip on the redistribution substrate, the molding layer having a connection portion, the connection portion penetrating the molding layer and connecting with the redistribution substrate; and
   external solder balls on a bottom surface of the redistribution substrate,
   wherein the redistribution substrate comprises,
   an insulating pattern on the conductive pad, the insulating pattern exposing a portion of the conductive pad,
   a passivation layer covering the insulating pattern and the conductive pad, and
   a redistribution pattern on the passivation layer,
   wherein a portion of the redistribution pattern penetrates the passivation layer to contact with the conductive pad,
   wherein the redistribution pattern includes an isolation region penetrating the passivation layer to contact with the insulating pattern, and
   wherein a width of the redistribution pattern is same or smaller than a width of the conductive pad.

2. The semiconductor package of claim 1, wherein the isolation region separates the passivation layer into a first passivation pattern and a second passivation pattern,
   the first passivation pattern is on the portion of the conductive pad exposed by the insulating pattern, and
   the second passivation pattern is in side of the conductive pad.

3. The semiconductor package of claim 2, wherein the isolation region isolates the first and second passivation patterns from each other, and
   the isolation region fills a space between the first and second passivation patterns.

4. The semiconductor package of claim 2, wherein a portion of the first passivation pattern is on the insulating pattern, and
   a portion of the insulating pattern is between the conductive pad and a portion of the first passivation pattern.

5. The semiconductor package of claim 2, wherein a portion of the second passivation pattern is on the insulating pattern, and
   an inner sidewall of the insulating pattern is coplanar with an inner sidewall of the isolation region.

6. The semiconductor package of claim 2, wherein a level of the first passivation pattern is same as a level of the second passivation pattern.

7. The semiconductor package of claim 2, wherein an outer sidewall of the first passivation pattern is inside an edge of the conductive pad when viewed from a plan view.

8. The semiconductor package of claim 1, wherein a portion of the insulating pattern is between the conductive pad and the isolation region.

9. The semiconductor package of claim 1, further comprising:
   a shielding pattern extending from the redistribution pattern and filling a space between the first and second passivation patterns, the shielding pattern having a lower hygroscopic property than the redistribution pattern.

10. A semiconductor package comprising:
    a redistribution substrate;
    a semiconductor chip mounted on the redistribution substrate through a conductive pad on one surface of the semiconductor chip;
    a molding layer covering the semiconductor chip on the redistribution substrate, the molding layer having a connection portion, the connection portion penetrating the molding layer to connect with the redistribution substrate; and
    external solder balls on a bottom surface of the redistribution substrate,
    wherein the redistribution substrate comprises,
    a first passivation pattern on the conductive pad, the first passivation pattern exposing a portion of the conductive pad,
    a second passivation pattern outside the first passivation pattern, the second passivation pattern laterally spaced apart from the first passivation pattern,
    a redistribution pattern covering the portion of the conductive pad exposed by the first passivation pattern and surrounding the first passivation pattern, and
    an insulating pattern between the conductive pad and the first passivation pattern, and
    wherein a width of the redistribution pattern is greater than a width of the conductive pad.

11. The semiconductor package of claim 10, wherein the redistribution pattern includes an isolation region filling a space between the first and second passivation patterns.

12. The semiconductor package of claim 11, wherein the isolation region is outside an edge of the conductive pad when viewed from a plan view.

13. The semiconductor package of claim 11, wherein a portion of the insulating pattern is extended between the conductive pad and the isolation region.

14. The semiconductor package of claim 10, wherein a level of the first passivation pattern is same as a level of the second passivation pattern.

15. The semiconductor package of claim 10, wherein an outer sidewall of the first passivation pattern is outside an edge of the conductive pad when viewed from a plan view.

16. The semiconductor package of claim 10, further comprising:
    a shielding pattern extending from the redistribution pattern and filling a space between the first and second passivation patterns, the shielding pattern having a lower hygroscopic property than the redistribution pattern.

17. A semiconductor package comprising:
    a lower package including a redistribution substrate, a semiconductor chip mounted on the redistribution substrate, a molding layer covering the semiconductor chip on the redistribution substrate;
    an upper package on the lower package, the upper package electrically connecting to the redistribution substrate through a connection portion which is in the molding layer; and
    external solder balls on a bottom surface of the redistribution substrate,
    wherein the redistribution substrate comprises,
    an insulating pattern covering a conductive pad which is on a bottom surface of the semiconductor chip, the insulating pattern exposing a portion of the conductive pad,
    a passivation layer covering the insulating pattern and the conductive pad, the passivation layer having a first passivation pattern on the conductive pad, and a second passivation pattern laterally spaced apart from the first passivation pattern, and a redistribution pattern on the passivation layer, wherein a portion of the redistribution pattern penetrates the first passivation pattern to contact with the conductive pad, wherein the redistribution pattern includes an isolation region filling a space between the first and second passivation patterns, and wherein a width of the redistribution pattern is same or smaller than a width of the conductive pad.

18. The semiconductor package of claim 17, wherein the isolation region isolates the first and second passivation patterns from each other, and the isolation region is on the conductive pad.

19. The semiconductor package of claim 17, wherein a portion of the first passivation pattern is on the insulating pattern, and a portion of the insulating pattern is between the conductive pad and a portion of the first passivation pattern.

20. The semiconductor package of claim 17, wherein a portion of the second passivation pattern is on the insulating pattern, and an inner sidewall of the insulating pattern is coplanar with an inner sidewall of the isolation region.

\* \* \* \* \*